United States Patent [19]
Kawamata et al.

[11] 4,257,060
[45] Mar. 17, 1981

[54] SEMICONDUCTOR SWITCH

[75] Inventors: Shigeru Kawamata; Kiyoshi Tsukuda, both of Ibaraki, Japan

[73] Assignee: Hitachi, Ltd., Japan

[21] Appl. No.: 972,872

[22] Filed: Dec. 26, 1978

[30] Foreign Application Priority Data

Dec. 23, 1977 [JP] Japan .................................. 52-154509

[51] Int. Cl.³ ..................... H01L 27/04; H03K 17/735
[52] U.S. Cl. ........................................ 357/49; 357/38; 307/303; 340/166 FE
[58] Field of Search ............................ 357/47, 48, 49; 340/166 FE, 166 R; 307/213, 303

[56] References Cited

U.S. PATENT DOCUMENTS

| | | | |
|---|---|---|---|
| 3,819,867 | 6/1974 | McCarthy et al. | 357/38 |
| 4,015,143 | 3/1977 | Tokunaga et al. | 357/38 |

FOREIGN PATENT DOCUMENTS 2451861 5/1975 Fed. Rep. of Germany ............. 357/49
2655622 6/1977 Fed. Rep. of Germany .

OTHER PUBLICATIONS

International Switching Symposium, 1976, pp. 221-4-1 through 221-4-8.

*Primary Examiner*—William D. Larkins
*Attorney, Agent, or Firm*—Craig & Antonelli

[57] ABSTRACT

In a semiconductor switch for use in a telephone exchange, interference between separate switching units located on a single chip is frequently a problem. To overcome this, a semiconductor switch is provided with a plurality of islands of silicon monocrystal disposed in a supporting body of silicon polycrystal through a dielectric film having a plurality of switching circuit islands, at least one driving circuit island, and a plurality of protective circuit islands, wherein a region to reduce parasitic capacitance is formed between said switching circuit islands by arranging the switching circuit islands to be isolated from one another through said region.

12 Claims, 11 Drawing Figures

SEMICONDUCTOR SWITCH

BACKGROUND OF THE INVENTION

This invention relates generally to a semiconductor switch, and more particularly to a semiconductor cross-point switch suitably usable in a telephone exchange.

For many years, the cross bar switch, which is a metallic contact switch, has been employed as the basic switch of a telephone exchange. Since the cross bar switch is a mechanical switch, the operating speed is low. Moreover, the metal of the contacts is subject to heavy wear, which reduces the lifetime and reliability of the switch. Another disadvantage is that noise which arises from the contact is great. Further, exchanges employing the cross bar type switch are large in size and heavy in weight, and therefore require a large place of installation. Such cross bar switches also suffer from the disadvantage of a high maintenance cost on account of a high driving power of the switch.

Telephone exchanges have become quite large due to a great increase in the number of circuits, and have often been used in coupling with electronic systems such as picture transmission systems and computers. Therefore, a switch for an exchange should preferably be small in size and, simultaneously, high in the operating speed and reliability. Accordingly, it is desirable to use a semiconductor cross-point switch to replace the cross bar switch since such a cross-point switch operates electronically and is high in its response rate.

Characteristics required for the switch of the telephone exchange are that the withstand voltage is high, a high current being permitted to flow, and that the resistance at turning-on is low, while the resistance at turning-off is high. In order to easily attain these characteristics, it is generally most suitable to employ a thyristor for a switching circuit. The cross-point switch which employs the thyristor for the switching circuit should include a driving circuit and a protective circuit along with the switching circuit in order to fulfill the switching function as explained hereinafter.

The cross-point switch which is fabricated by arranging the switching circuit portions, the driving circuit portions and the protective circuit portions without a specific order on a chip causes problems in that it operates erroneously. Further, since the wiring becomes complicated, the chip size is large, and the density of integration becomes low. It has been revealed that since a voltage being as high as 200 V is applied to the switching circuit portions, the switching circuit portions interfere with one another to have undesirable effects on the switching characteristics when they are arranged adjacent to one another. Ordinarily, any high voltage applied to the driving circuit portions or the protective circuit portions does not affect other portions, so that they may be arranged in adjacency. Moreover, a parasitic capacitance develops under a metallic interconnection. In the case of arranging the circuits in a disorderly manner, the interconnection becomes long. This causes the parasitic capacitance to become large, which can cause the malfunction of the switching circuit portion.

In U.S. Pat. No. 4,015,143 a semiconductor switch is described which is large in dv/dt bearing capacity regardless of the anode or cathode potential, high in breakdown voltage, capable of being closed with a small control current, and easy to be included in semiconductor integrated circuits.

West German Offenlegungsschrift No. 2,655,622 sets forth a partial plan view showing a semiconductor integrated circuit which is equipped with a thyristor device.

These references, however, do not describe a disposition of the switching circuit portions, the driving circuit portion and the protective circuit portions on a chip in a manner to prevent interference between the switching circuit portions.

SUMMARY OF THE INVENTION

It is, therefore, one object of the present invention to overcome these problems by providing a semiconductor switch which can easily prevent interference among switching circuit portions, shorten interconnections among the circuit portions, and provide a high integration of various circuit portions within a chip.

Another object of the present invention is to provide a semiconductor cross-point switch with a thyristor suitably usable in a telephone exchange.

In order to accomplish these and other objects, this invention arranges one set of switching circuit portions in such a manner that they are isolated from one another through a driving circuit portion or protective circuit portions disposed adjacent to the switching circuit portions.

One aspect of the present invention, more specifically, is to provide a semiconductor switch with a plurality of islands of silicon monocrystal disposed in a supporting body of silicon polycrystal through a dielectric film, comprising switching circuit islands formed independently with switching circuits having thyristors, at least one driving circuit island, protective circuit islands, a region to reduce parasitic capacitance which is developed between said switching circuit islands, said switching circuit islands arranged in a manner to be isolated from one another through said region, and means for electrically connecting said switching circuits, said driving circuit and said protective circuits. Said parasitic capacitance reducing region may be provided by said driving circuit island or islands. Moreover, said region may also be provided by the protective circuit island or islands.

A further aspect of the present invention is to provide a semiconductor cross-point switch with a plurality of islands of silicon monocrystal disposed in a supporting body of silicon polycrystal through a dielectric film, comprising a set of switching circuit islands providing switching circuits with thyristors, a set of driving islands providing a driving circuit, two sets of protective islands providing protective circuits, the set of driving islands and the sets of protective circuit islands disposed adjacently to the respective set of switching circuit islands, whereby the switching circuit islands are isolated from one another by islands selected from the driving circuit island or the protective circuit islands.

DETAILED DESCRIPTION OF THE DRAWINGS

Figure 1:
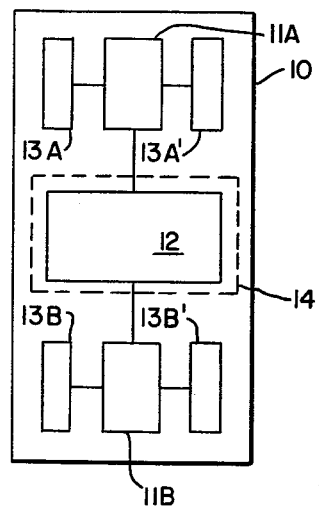
FIG. 1 is a block diagram showing one embodiment of the present invention.

Referring now to the drawings and, in particular, to FIG. 1, a preferred embodiment of the present invention is shown as blocks of a cross-point switch. The minimum nominal unit of a cross-point switch for a telephone exchange is one (1) point, which is constructed of two switching circuit portions 11A, 11B, at least one driving circuit portion 12 therefor, and two protective circuit portions 13A, 13A' and 13B, 13B' for the respective switching circuit portions 11A, 11B.

The switching circuit portions 11A, 11B, the driving circuit portion 12, and the protective circuit portions 13A, 13A', 13B, 13B' are disposed in a chip 10 as shown in FIG. 1. By this disposition, the protective circuit portions 13A, 13A' and 13B, 13B' are disposed at both sides of the switching circuit portions 11A, 11B and the driving circuit portion is disposed between the switching circuit portions in such a manner that the two switching circuit portions 11A, 11B do not adjoin each other. Functional elements of the respective circuit portions are formed in silicon monocrystal islands which are isolated from one another by a silica film and polycrystallic silicon. The functional elements are fabricated by selective diffusion after forming a pattern in the silica film by known photoetching technique, such as that shown, for example, in U.S. Pat. No. 3,135,638.

The chip 10 of FIG. 1 has a circuit arrangement in which the driving circuit portion is centered and the switching circuit portions are arranged at the end portions of the chip 10. The disposition in which the driving circuit portion is arranged between the switching circuit portions forms a region to reduce a parasitic capacitance arising between the two switching circuit portions 11A, 11B. The two switching circuit portions 11A, 11B are perfectly isolated by the region 14 so as not to raise or to sufficiently reduce the parasitic capacitance so that a malfunction is not caused by the charging current. In the case of FIG. 1, the disposition or existence of the driving circuit portion 12 forms the region 14 and hence, reduces the parasitic capacitance.

Moreover, the switching circuit portion 11A, the driving circuit portion 12 and the protective circuit portions 13A, 13A', and the switching circuit portion 11B, the driving circuit portion 12 and the protective circuit portions 13B, 13B' are arranged adjacent to each other. Therefore, the connection between the respective circuits can be made at the shortest distance. Accordingly, a parasitic capacitance arising under the interconnection can be diminished to the extent that it exerts no significance influence on the switching characteristics. By arranging the respective circuit portions within the chip 10 functionally and reasonably in this manner, the wiring is simplified, and hence, the enhancement of the density of integration can be achieved.

Figure 2:
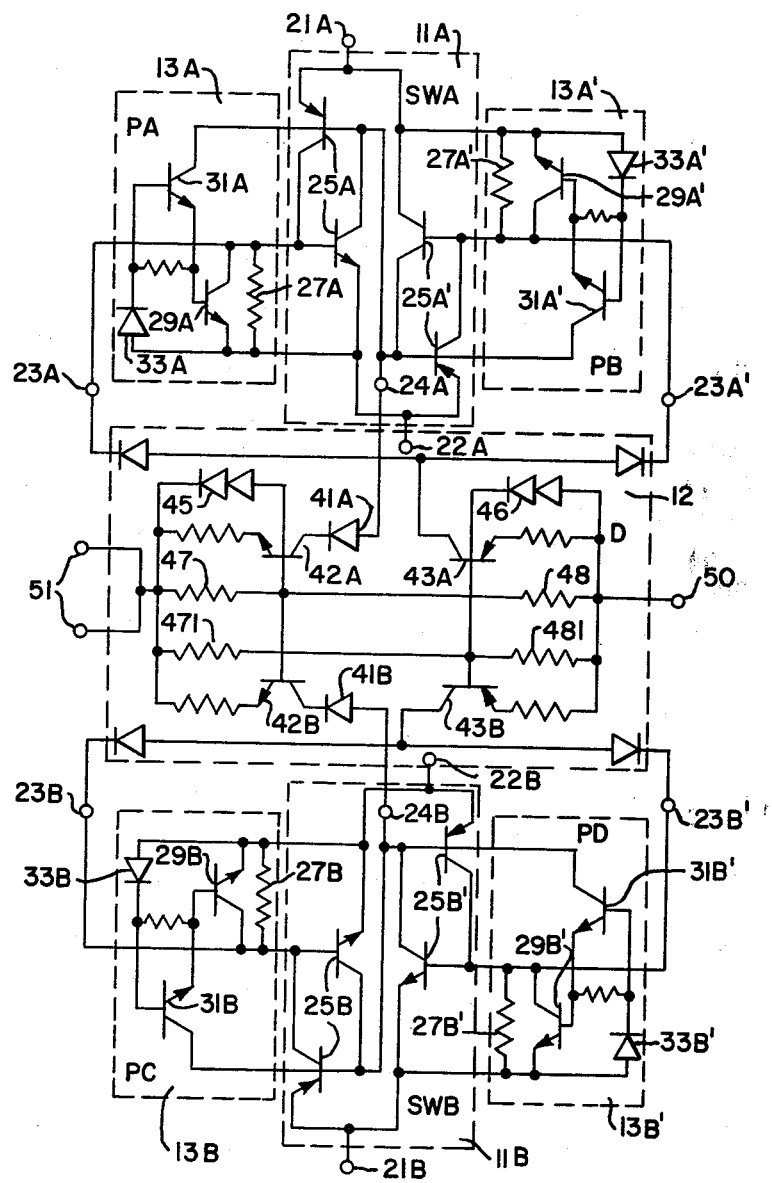
FIG. 2 is a circuit diagram showing the contents of the blocks of FIG. 1 in detail.

An example of the operation of such a circuit will now be explained with reference to FIG. 2. Although, on the cross-point switch of a semiconductor used in a telephone exchange, it is necessary to fulfill the switching function so that it comprises the three constituents of the switching circuit portions 11A, 11B, the driving circuit portion 12 and the protective circuit portions 13A, 13A' and 13B, 13B', since the operation of one set is the same as that of the other set, the operation of one set with A on elements will be hereinafter explained. The operation of the other set with B should be inferred on the analogy of the set.

A ringer signal of an A.C. voltage of 75 V needs to be passed through the cross-point switch to cause it to begin operation. Since, for this reason, the voltage-to-ground (voltage-to-earth) of anode and cathode terminals 21A, 22A fluctuates, a gate current needs to be kept flowing throughout the period in which the ringer signal is passed. An anode gate terminal 24A therefore needs to be disposed in addition to a usual cathode gate terminal 23A which operates with a gate signal of low voltage.

In order to ignite thyristors 25A, 25A' in a switching circuit portion 11A, a gate driving circuit portion 12 is required. Since the thyristors 25A, 25A' have a large holding current, a noise is generated when the current of the switching circuit portion 11A is cut off abruptly. The holding current can be diminished by causing the gate current to continuously flow, and hence, the generation of the noise can be prevented. It is therefore necessary that the driving circuit portion 12 is a constant-current circuit of high withstand voltage. The constant-current circuit is well known and, as shown in the figure, comprises a transistor 42A connected with the anode gate terminal 24A through a diode 41A, a transistor 43A connected with the cathode gate terminal 23A, a pair of diodes 45, 46 and resistors 47, 48. Numerals 50, 51 are current source terminals.

Now, protective circuit portions 13A, 13A' will be discussed.

In order to lessen the influence which the gate current for igniting the thyristors 25A, 25A' exerts on the circuitry of the telephone exchange, it is desirable to make the gate sensitivity of the thyristors 25A, 25A' high. As regards the gate sensitivity of the thyristors 25A, 25A', a high sensitivity is attained by adding resistors 27A, 27A' between the cathode gate terminals 23A, 23A' and the cathode terminal 22A. In order to prevent the thyristors 25A, 25A' from being erroneously ignited by dv/dt, the charging current of the junction of the thyristors 25A, 25A' may be bypassed by transistors 29A, 29A' which are incorporated between the cathode gate terminals 23A, 23A' and the cathode terminal 22A, and a high dv/dt bearing can be attained. The protective circuit portions 13A, 13A' made up of the transistors 29A, 29A', the resistors 27A, 27A' etc. are circuits which are necessary for preventing the malfunction of the switching circuits 11A, 11A'. Details of such a protective circuit can be found in ISS, "International Switching Symposium," 1976 on pages 211-4-1 to 211-4-8.

When the dv/dt is passed to the anode terminal 21, a current is generated in transistors 31A, 31A' and hence, the transistors 29A, 29A' actuate and fall into the "on" state. By this operation, a short-circuit is made between the gates of the thyristors 25A, 25A' and the cathode terminal 22A. A charging current or displacement current generated in the thyristors 25A, 25A' by the dv/dt is bypassed through the transistors 29A, 29A' to the cathode terminal 22A, so that the thyristors 25A, 25A' are not caused to turn-on by the charging current. The transistors 29A, 29A' act as a short emitter element between the gates and the cathode terminals. The resistors 27A, 27A' act as a short emitter element as to the transistors 29A, 29A' and actuate, when the transistors 29A, 29A' do not actuate by the dv/dt.

Diodes 33, 33A' function to cause the base of the transistors 29A, 29A' not to be adversely biased, in order to prevent any malfunction caused by the breakdown of the emitter of the transistors 29A, 29A' charged by the discharging current from the junction of the thyristors upon an abrupt change of the anode voltage of the thyristors.

As described above, for the cross-point switch of a semiconductor, it is a necessary condition for fulfilling the switching function that it comprises the three constituents of the switching circuit portions 11, the driving circuit portion 12 and the protective circuit portions 13.

Figure 3:
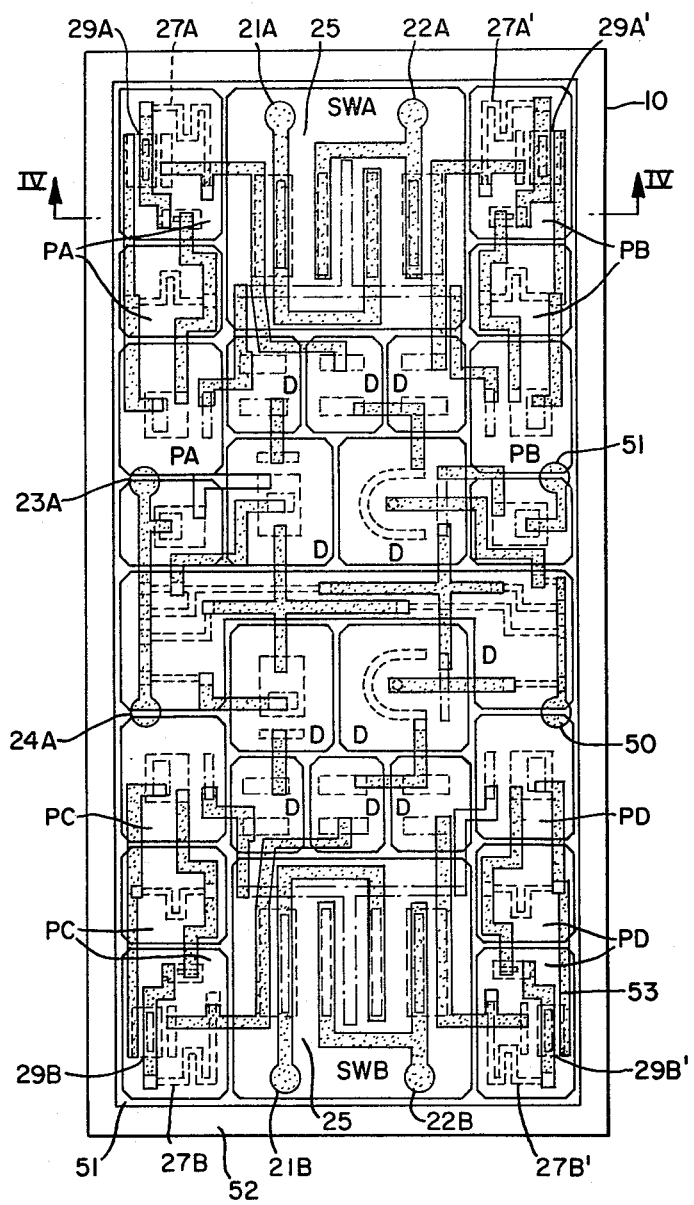
FIG. 3 is a surface pattern diagram showing the disposition of the circuit portions of FIG. 2 on a chip.

FIG. 3 shows a plan pattern of the chip 10 in FIG. 1. $SW_A$ and $SW_B$ designate silicon monocrystal islands in which the thyristors 25A, 25A' constituting the switching circuit portions 11A, 11B are formed. D designates silicon monocrystal islands in which circuit elements constituting the driving circuit portion 12 are formed. $P_A$, $P_B$ and $P_C$, $P_D$ designates silicon monocrystal islands in which circuit elements of transistors 29A, 29A', resistors 27A, 27A' etc. constituting the protective circuit portions 13A, 13A', 13B, 13B' respectively are formed. Numeral 51 designates a dielectric film which isolates the silicon monocrystal islands from one another and the silicon monocrystal islands from a supporting body of silicon polycrystal 52. Dotted parts 53 are aluminum interconnections for connecting impurity diffused regions in the silicon monocrystal islands. These are formed by the photoetching technique, the vacuum evaporation technique etc. which are well known. The surface of the chip 10 is covered with a silica film except parts at which the aluminum interconnections 53 are held in ohmic contact. Diffused regions of the p-type and diffused regions of the n-type which constitute the circuit elements are respectively indicated by broken lines and one-dot chain lines.

Since the switching circuit portions $SW_A$ and $SW_B$ are isolated from each other through the driving circuit portion D and a part of the protective circuit portions $P_A$-$P_D$, they do not interfere with each other. Since the aluminum interconnections 53 connect the circuit elements at the shortest distances and are simplified, parasitic capacitances which develop under the interconnections are reduced.

Consider a case where the switching circuit portions 11A, 11B, i.e. $SW_A$ and $SW_B$, are arranged in adjacency. In this case, when a high electric field is applied to the thyristors 25A, 25A' of the portion $SW_A$, a parasitic capacitance which develops between both the monocrystal islands $SW_A$ and $SW_B$ becomes large, and the charging current thereof causes such a malfunction that the thyristors 25B, 25B' of the portion $SW_B$ falls into the "on" state at the operation of the portion $SW_B$. When a negative electric field is applied to the portion $SW_A$, inversion layers appear in the bottom part and the side surface parts of the other monocrystal island $SW_B$. This abnormal phenomena causes the blocking voltage of the thyristors to lower, and ignition sensitivity changes arise in the thyristor characteristics. Besides, in the case of the adjacency of the portions $SW_A$ and $SW_B$, the aluminum interconnection 53 to which a high electric field is applied becomes very complicated, and hence, a similar inversion layer appears under the interconnection 53 and causes the degradation of the blocking voltage of the thyristors 25A, 25A' and 25B, 25B'.

Figure 3A:
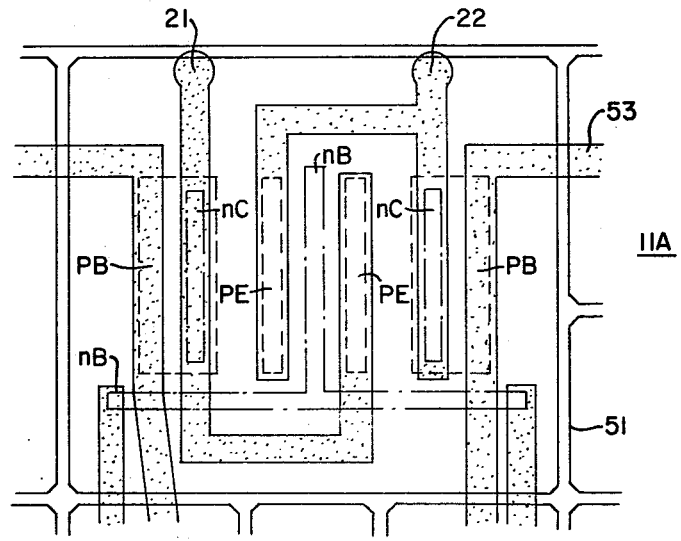
FIGS. 3A, 3B, and 3C are detailed diagrams each showing portions of FIG. 3.
Figure 3B:
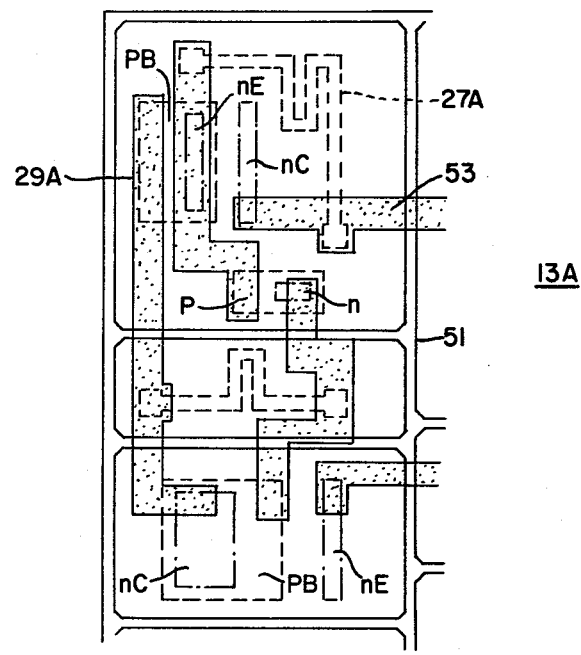
Figure 3C:
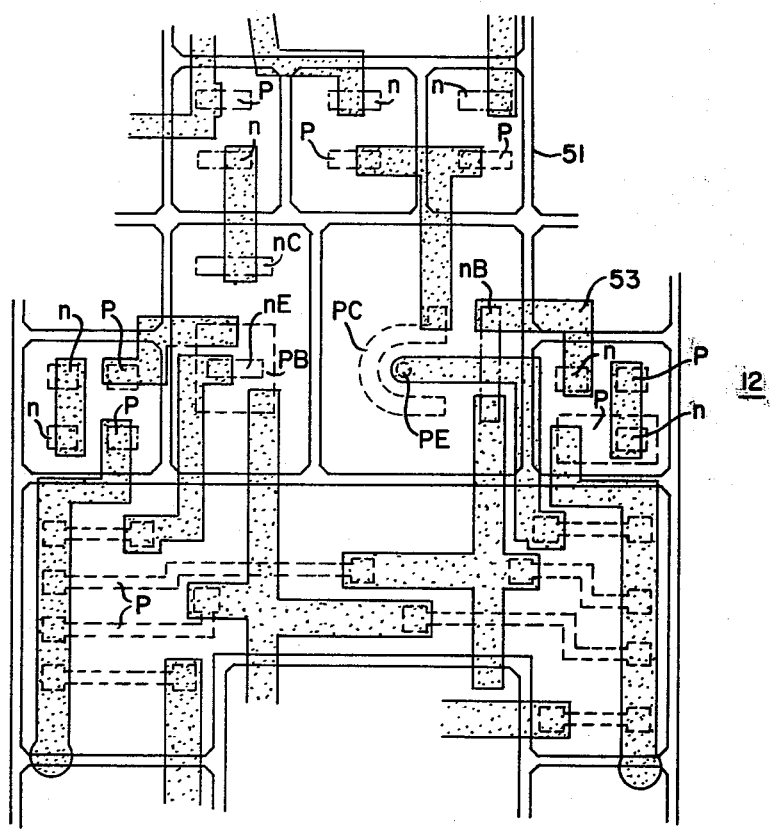

FIGS. 3A, B and C show in detail the disposition of a functional element unit by enlarging respectively the switching circuit portion 11A, the protective circuit portion 13A and the driving circuit portion 12. In these figures, p designates a p-type diffusion layer, n designates an n-type diffusion layer, E designates an emitter, B designates a base and C designates a collector. The thyristor portion is a planar type thyristor of lateral structure, and $h_B$ is disposed in the center of both thyristors 25A, 25A' and is made common to these thyristors.

Figure 4:
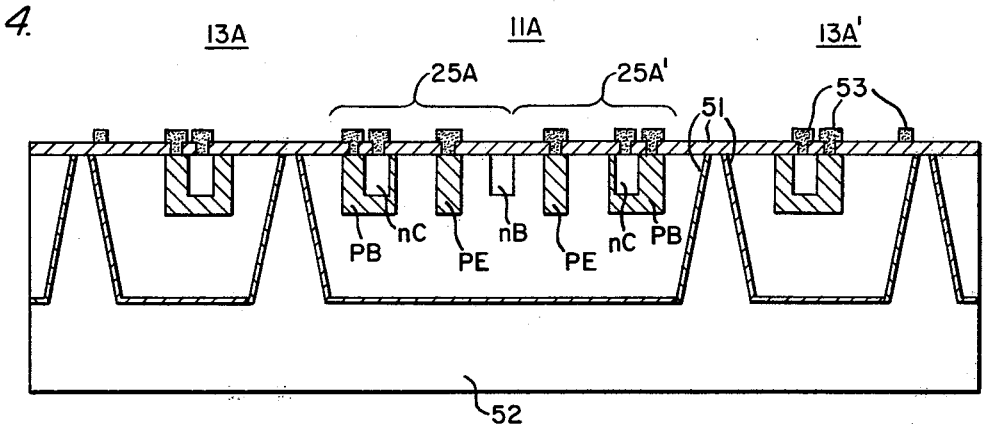
FIG. 4 is an enlarged cross-sectional view taken along the line IV—IV in FIG. 3.

In FIG. 4, a cross-section of FIG. 3 is given to show how the monocrystal islands $SW_A$, $P_A$ and $P_B$ are dielectrically isolated by a $SiO_2$ film 51 and supported by a polycrystal silicon body 52.

As illustrated in FIG. 3, according to one aspect of this invention, the portions $SW_A$ and $SW_B$ are isolated and set apart from each other to the utmost, whereby the parasitic capacitance can be made low, and also the development of the inversion layers can be weakened so that the interference between the switching circuit portions can be prevented. Even when the switching circuit portion 11 and the driving circuit portion 12 or the protective circuit portion 13 are arranged in adjacency, they do not interfere with each other in circuit operations.

Figure 5:
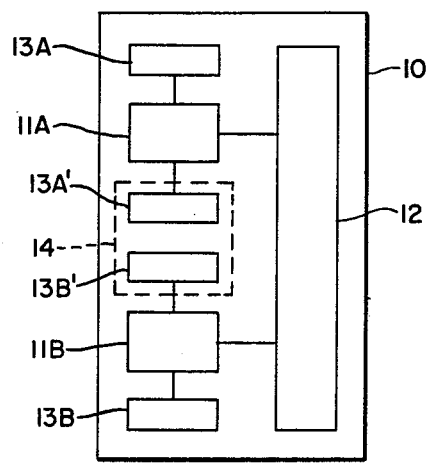
FIG. 5 is a block diagram showing another embodiment of the invention.

Now, a second embodiment will be discussed by referring to FIG. 5, in which identical numerals are given to identical elements in FIG. 1. In FIG. 5, a switching circuit portion 11, a driving circuit portion 12 and a protective circuit portion 13 are disposed on a cross-point switch chip 10 with protective circuit portions 13A, 13A' and 13B, 13B' disposed around switching circuit portions 11A, 11B. As apparent from the drawing, a set of the switching circuit portions 11A, 11B and the protective circuit portions 13A, 13A', 13B', 13B are arrayed in a line, and the driving circuit portion 12 is disposed in parallel to the line.

The protective circuit portions 13A', 13B form a region 14 to set apart the switching circuit portions 11A and 11B from each other. Thus, since the switching circuit portions 11A, 11B are disposed apart from each other by the region 14, the interference between the switching circuit portions 11A, 11B is avoided. According to this disposition, the switching circuit portions 11A, 11B is driven by one driving circuit portion and hence, the density of integration of the driving circuit portion 12 is improved. Besides, the interconnection between each circuit portion is shortened to the utmost.

Figure 6:
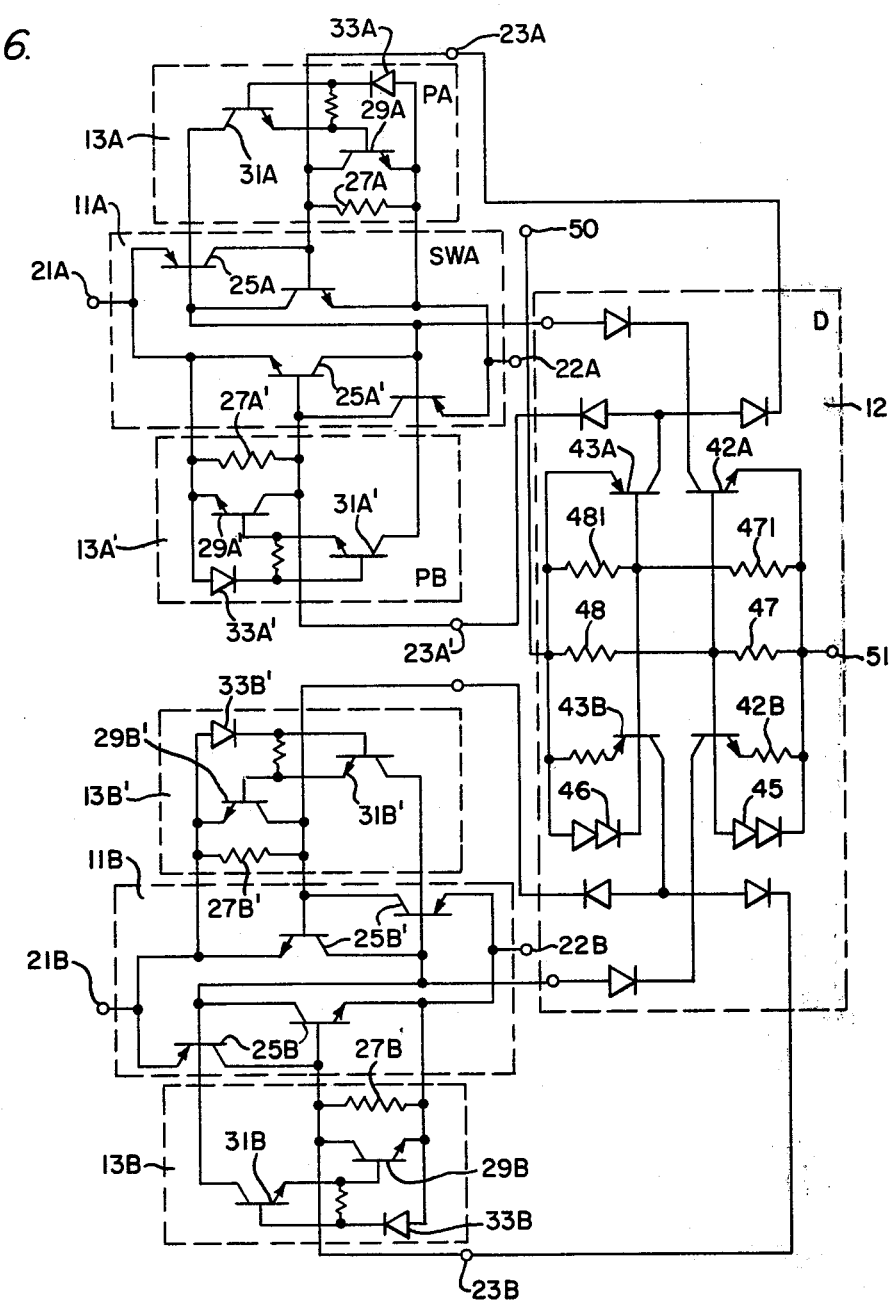
FIG. 6 is a circuit diagram showing the contents of the blocks of FIG. 5 in detail.

FIG. 6 shows in detail the circuits of the blocks in FIG. 5. These circuits operate in the same manner as discussed heretofore in regard to FIG. 2.

Since the semiconductor cross-point switch is used to replace the prior-art cross bar switch, it is strongly desirable to be low in cost as well as having superior switching performance. To this end, it is desired to arrange a large number of points within one chip and to raise the density of integration.

Figure 7:
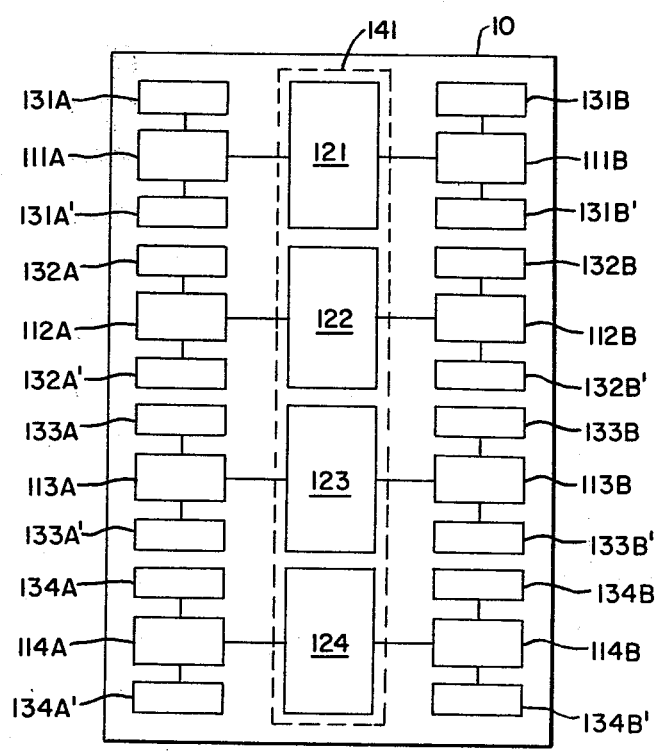
FIG. 7 is a block diagram showing another embodiment of the invention.

FIG. 7 shows such an arrangement in which a semiconductor cross-point switch chip 10 with cross-point switches of four points constructed within an identical chip according to another embodiment of this invention. This conforms with the method of arranging the circuit portions in the first embodiment, and is of an arrangement in which driving circuit portions 121, 122, 123, 124 are vertically arrayed in series in the center of the chip 10. At both sides of the series of the driving circuit portions, switching circuit portions 111, 112, 113, 114 and protective circuit portions 131, 132, 134 are vertically arrayed in series.

Figure 8:
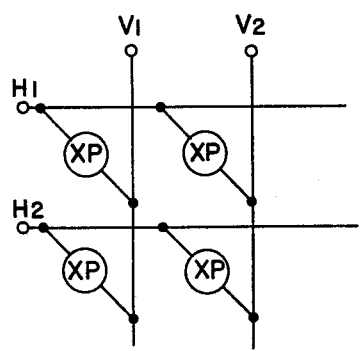
FIG. 8 is a circuit diagram showing a matrix of a cross-point switch of four points.

FIG. 8 shows a matrix of cross-point switches of four points. A telephone exchange is formed of the matrix of lines $V_1$ and $V_2$ and lines $H_1$ and $H_2$, among which the cross-point switches XP each being of one point are assembled. The semiconductor cross-point switches of four points in FIG. 7 have a structure in which the matrix in FIG. 8 is constructed within one chip. As apparent from FIG. 8, the line V and the line H are connected in two places with interconnections from terminals of each cross-point switch XP, and the terminals on the same line can be made common. As connection terminals to be externally led out from the chip 10 in FIG. 7, sixteen terminals are necessary except the driving circuit portions 121 because the switching circuit portions 111, 112, 113, 114 are formed of eight thyristors. Among them, six terminals can be made common, and the remaining ten terminals may be disposed. When the number of terminals to be disposed in the chip decreases, the density of integration is enhanced, and there is also the advantage that the wiring can be simplified. An arrangement is also possible in which several columns are arrayed in the lateral direction according to the method of arrangement of the second embodiment of this invention. Of course, the method of arrangement is also applicable to the arrangement of circuit portions of a power IC composed of a high voltage circuit portion and a low voltage circuit portion, other than the circuit portions of the cross-point switch.

According to the arrangement of circuit portions in this invention, the switching circuits $SW_A$ and $SW_B$ can be constructed in a manner to be isolated from each other, and the driving circuit portion 12 and the protective circuit portion 13 can be arranged in adjacency to the switching circuit portion 11. Therefore, the prevention of the interference between the switching circuits and the shortening of an interconnection for coupling circuits can be simultaneously achieved.

It is to be understood that the above-described arrangements are simply illustrative of the application of the principles of this invention. Numerous other arrangements may be readily devised by those skilled in the art which embodies the principles of the invention and fall within its spirit and scope.

We claim:

1. A semiconductor cross-point switch having a plurality of islands of silicon monocrystal disposed in a supporting body of silicon polycrystal through a dielectric film, comprising:
   a set of switching circuit islands, each comprising switching circuits comprised of one or more thyristors for alternately turning on and off to respectively pass or block current flow through the thyristors in accordance with control signals applied to control gates of the thyristors;
   a set of driving circuit islands providing a driving circuit comprising means for igniting said thyristors of said switching circuits by providing the control signals to the control gates of the thyristors; and
   two sets of protective islands providing protective circuits comprising means for preventing erroneous ignition of the thyristors of said switching circuit,
   wherein the set of driving islands the sets of protective circuit islands are disposed adjacently to the respective set of switching circuit islands, so that the switching circuit islands are isolated from one another by the protective circuit islands.

2. A semiconductor switch having a plurality of islands of silicon monocrystal disposed in a supporting body of silicon polycrystal through a dielectric film, comprising:
   a plurality of switching circuit islands formed independently from one another, said switching circuit islands having switching circuits comprised of thyristors for alternately turning on and off to respectively pass or block current flow through the thyristors in accordance with control signals applied to control gates of the thyristors;
   at least one driving circuit island having a driving circuit comprising means for igniting the thyristors of said switching circuits by providing the control signals to the control gates of the thyristors;
   a plurality of protective circuit islands formed independently from one another, each protective circuit comprising means for preventing erroneous ignition of the thyristors of said switching circuits; and
   means for electrically connecting said switching circuits, said driving circuit and said protective circuits, wherein said switching circuit islands are arranged around said driving circuit island in a manner to be isolated from one another by said driving circuit island to reduce parasitic capacitance which is developed between said switching circuit islands.

3. A semiconductor switch having a plurality of islands of silicon monocrystal disposed in a supporting body of silicon polycrystal through a dielectric film, comprising:
   a plurality of switching circuit islands formed independently from one another, said switching circuit islands having switching circuits comprised of thyristors for alternately turning on and off to respectively pass or block current flow through the thyristors in accordance with control signals applied to control gates of the thyristors;
   at least one driving circuit island having a driving circuit comprising means for igniting the thyristors of said switching circuits by providing the control signals to the control gates of the thyristors;
   a plurality of protective circuit islands formed independently from one another, each protective circuit comprising means for preventing erroneous ignition of the thyristors of said switching circuits; and
   means for electrically connecting said switching circuits, said driving circuit and said protective circuits, wherein said switching circuit islands are arranged around at least one of said protective circuit islands in a manner to be isolated from one another by said protective circuit island to reduce parasitic capacitance which is developed between said switching circuit islands.

4. A semiconductor cross-point switch having a plurality of islands of silicon monocrystal disposed in a supporting body of silicon polycrystal through a dielectric film, comprising:
   a set of switching circuit islands, each comprising switching circuits comprised of one or more thyristors for alternately turning on and off to respectively pass or block current flow through the thyristors in accordance with control signals applied to control gates of the thyristors;

a set of driving circuit islands providing a driving circuit comprising means for igniting said thyristors of said switching circuits by providing the control signals to the control gates of the thyristors; and two sets of protective islands providing protective circuits comprising means for preventing erroneous ignition of the thyristors of said switching circuit, wherein the set of driving islands and the sets of protective circuit islands are disposed adjacently to the respective set of switching circuit islands, so that the switching circuit islands are isolated from one another by the driving circuit islands.

5. A semiconductor switch according to claim 2 or 3, wherein each switching circuit comprises at least two thyristors arranged in parallel with one another with their respective directions of forward conduction being opposite to one another.

6. A semiconductor switch according to claim 2 or 3, wherein the protective circuits comprise means for bypassing the charging current of central junctions of the thyristors to prevent erroneous ignition of the thyristors.

7. A semiconductor switch of claim 3, wherein four protective circuit islands are provided, and two of these protective circuits are used to form said parasitic capacitance reducing region.

8. A semiconductor switch of claim 2, 3 or 4, wherein each switching circuit is constructed on an island of silicon monocrystal.

9. A semiconductor switch of claim 2, 3 or 4, wherein the driving circuit is constructed on a plurality of islands.

10. A semiconductor switch of claim 2, 3 or 4, wherein each protective circuit is constructed on a plurality of islands.

11. A semiconductor switch of claim 2, wherein said switching circuit islands are arranged on opposite sides of said driving circuit island.

12. A semiconductor switch of claim 7, comprising two switching circuit islands and said four protective circuit islands arranged along a straight line with said switching circuit islands each being disposed between two protective circuit islands and said two protective circuit islands from said parasitic capacitance reducing region being disposed between said two switching circuit islands.

* * * * *